(12) United States Patent
Robson et al.

(10) Patent No.: US 9,407,976 B2
(45) Date of Patent: Aug. 2, 2016

(54) PHOTONICALLY ROUTED TRANSMISSION LINE

(71) Applicant: Raytheon Company, Waltham, MA (US)

(72) Inventors: Michael H. Robson, Albuquerque, NM (US); Michael T. Pace, Albuquerque, NM (US)

(73) Assignee: RAYTHEON COMPANY, Waltham, MA (US)

( * ) Notice: Subject to any disclaimer, the term of this patent is extended or adjusted under 35 U.S.C. 154(b) by 361 days.

(21) Appl. No.: 14/172,282

(22) Filed: Feb. 4, 2014

(65) Prior Publication Data

US 2015/0222966 A1    Aug. 6, 2015

(51) Int. Cl.
*H04J 14/00*    (2006.01)
*H04Q 11/00*    (2006.01)
*H04B 10/2575*    (2013.01)
*H04B 10/00*    (2013.01)

(52) U.S. Cl.
CPC ........... *H04Q 11/0003* (2013.01); *H04B 10/00* (2013.01); *H04B 10/2575* (2013.01)

(58) Field of Classification Search
CPC ........... H04Q 11/0003; H04Q 11/0005; H04B 10/2575; H01Q 9/045; H01P 1/00
USPC ........... 398/45, 46, 47, 48, 49, 50, 51, 54, 52, 398/53, 56, 57, 79, 115; 385/24, 16, 17, 18; 343/904, 700 MS, 756; 333/161, 157, 333/81 A, 246, 205
See application file for complete search history.

(56) References Cited

U.S. PATENT DOCUMENTS

| | | | |
|---|---|---|---|
| 4,751,513 A | 6/1988 | Daryoush et al. | |
| 4,777,456 A | 10/1988 | Andrikian et al. | |
| 4,835,500 A * | 5/1989 | Sequeira | H01P 1/10 333/258 |
| 5,099,214 A | 3/1992 | Rosen et al. | |
| 5,481,232 A | 1/1996 | Wu et al. | |
| 5,514,499 A | 5/1996 | Iwamatsu et al. | |
| 5,761,351 A * | 6/1998 | Johnson | H01Q 3/2676 343/853 |
| 6,313,803 B1 | 11/2001 | Manasson et al. | |
| 6,483,480 B1 | 11/2002 | Sievenpiper et al. | |

(Continued)

FOREIGN PATENT DOCUMENTS

| | | |
|---|---|---|
| EP | 1345419 B1 | 11/2009 |
| EP | 1753084 B1 | 8/2011 |

(Continued)

OTHER PUBLICATIONS

Korala et al., "Transparent conducting films of CdSe(ZnS) core (shell) quantum dot xerogels", Chem. Commun. vol. 48, 2012, pp. 8523-8525.

(Continued)

*Primary Examiner* — Hanh Phan
(74) *Attorney, Agent, or Firm* — Cantor Colburn LLP

(57) ABSTRACT

A method of dynamically routing a transmission line in a photosensitive layer including optically switching elements and a system to dynamically route a transmission line are described. The method includes determining dimensions of the transmission line based on a radio frequency signal for transmission through the transmission line. The method also includes controlling a light source to illuminate a portion of the optical switching elements of the photosensitive layer according to the dimensions to route the transmission line.

20 Claims, 4 Drawing Sheets

(56) References Cited

U.S. PATENT DOCUMENTS

| | | |
|---|---|---|
| 6,646,525 B2 | 11/2003 | Bozler et al. |
| 7,271,877 B2 | 9/2007 | Fries |
| 7,466,269 B2 | 12/2008 | Haziza |
| 8,279,122 B2 | 10/2012 | Landon et al. |
| 8,373,609 B1 | 2/2013 | Dorsey et al. |
| 8,384,426 B2 | 2/2013 | Or-Bach |
| 2002/0043927 A1 | 4/2002 | Kimura |
| 2002/0085390 A1 | 7/2002 | Kiyomoto et al. |
| 2004/0234270 A1 | 11/2004 | Nishie et al. |
| 2008/0136337 A1 | 6/2008 | Rogojevic et al. |
| 2013/0141295 A1 | 6/2013 | Jiang et al. |
| 2014/0168751 A1 | 6/2014 | Suzuki et al. |

FOREIGN PATENT DOCUMENTS

| | | |
|---|---|---|
| EP | 2575211 A1 | 4/2013 |
| WO | 0120718 A1 | 3/2001 |

OTHER PUBLICATIONS

Lilly et al., "Switchable photoconductivity of quantum dot films using cross-linking ligands with light-sensitive structures", Journal of Material Chemistry, vol. 21, No. 31, Aug. 21, 2011, pp. 11441-11652.

Mentzel et al., "Nanopatterned Electrically Conductive Films of Semiconductor Nanocrystals", Nano Letters 12, No. 8, Aug. 8, 2012, pp. 1-18.

* cited by examiner

PHOTONICALLY ROUTED TRANSMISSION LINE

BACKGROUND

The present disclosure relates to switchable conductivity. In many applications, mechanical supports are used for electrical connections. For example, a printed circuit board (PCB) provides mechanical support for the electrical connections between components. The PCB includes conductive traces that are placed onto an insulating substrate. The form of each conductive trace is fixed after the design is complete, while the function of the traces can be controlled using discrete components such as switches. Jumper wires may be added to implement the alternate routing as an alternative, but these connections can become loose and affect the integrity of the conductive traces such that only pathways that were anticipated during the design and layout phase of the PCB are practicable.

SUMMARY

According to one embodiment, a method of dynamically routing a transmission line in a photosensitive layer including optically switching elements includes determining dimensions of the transmission line based on a radio frequency signal configured for transmission through the transmission line; and controlling a light source to illuminate a portion of the optical switching elements of the photosensitive layer according to the dimensions to route the transmission line.

According to another embodiment, a system to dynamically route a transmission line includes a photosensitive layer disposed on at least a portion of at least one side of a mechanical support; a controller configured to output dimensions of the transmission line based on a radio frequency signal configured for transmission through the transmission line; and a light source configured to controllably illuminate a portion of the photosensitive layer according to the dimensions to route the transmission line.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As noted above, when alternative conductive paths (e.g., electrical connections, radio frequency pathways) are needed, they must be pre-placed and additional components, such as switches, must be included to facilitate any change in connectivity. For example, when a PCB is fabricated, the placement of the components and the connections between them are planned, and the connectivity paths between components are deposited. These connectivity paths carry the current from one component to another, for example. During operation of the circuit, if the connectivity paths need to be changed to modify the circuit for any reason, the change is possible if the PCB was fabricated with the additional connectivity paths as well as switches that facilitate the change. If no such additional paths and switching elements were implemented during fabrication of the PCB, the PCB must be modified to facilitate the change. Embodiments of the system and method detailed herein relate to dynamically configurable conductivity paths based on optically switchable elements. These switchable connectivity paths do not require pre-planning or additional components like switches. The system and method discussed herein apply to any surface or mechanical support with conductive traces or paths (e.g., circuit board, radome lining).

Additional embodiments described herein relate specifically to photonically routed transmission lines for transmission of radio frequency (RF) energy. Because the propagation of RF energy through a transmission line is affected by the cross-sectional geometry of the line and the conductivity of the material from which it is made, the switchable connectivity pathways defining transmission lines additionally include a determination of specific dimensions for the photoexcitation described below.

Figure 1:
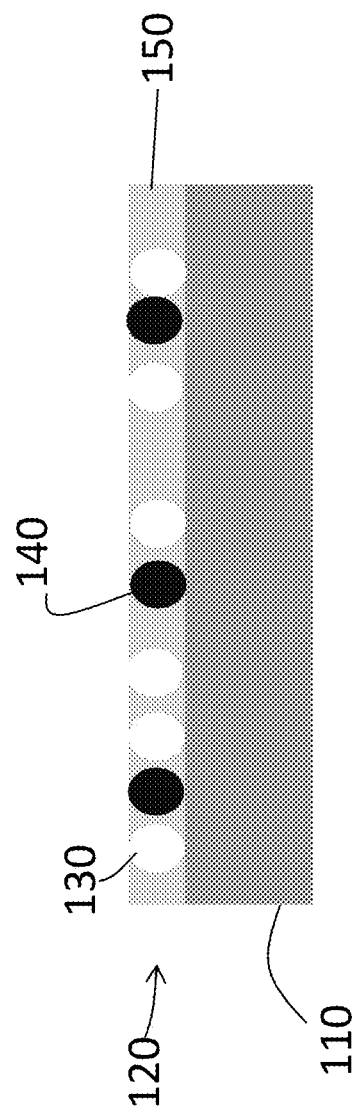
FIG. 1 is a cross-sectional view of a device with configurable conductivity paths according to an embodiment of the invention.

FIG. 1 is a cross-sectional view of a device with dynamically configurable conductivity pathways according to an embodiment of the invention. The embodiment shown in FIG. 1 includes a substrate 110 to mechanically support a photosensitive layer 120 with the configurable conductivity paths, but the exemplary embodiment does not limit the mechanical supports and shapes contemplated for the device. The substrate 110 is non-conductive and may be a dielectric layer. While the photosensitive layer 120 is shown as being deposited over one entire surface of the substrate 110 in FIG. 1, the photosensitive layer 120 may be deposited over at least a portion of at least one side of the substrate 110. The photosensitive layer 120 includes at least one type of optical switching element (OSE) 130, and may also include at least one type of field transmission element (FTE) 140, and one or more types of an immobilizing material (IM) 150. When the IM 150 is present, the OSE 130 and FTE 140 are fillers in the IM 150, which is the body of the film making up the photosensitive layer 120. The IM 150 is made from a material or a blend of materials that are transparent to high energy photons and provides mechanical and environmental stability to the fillers (OSE 130 and FTE 140). For example, the IM 150 may be a polymethyl methacrylate (PMMA), poly isobutylene (PIB), or poly ether imide (PEI). When the IM 150 is present, the filling factor must be sufficiently high for the fillers (OSE 130 and FTE 140) to be in electrical contact with one another but must also be sufficiently low such that the integrity of the resulting film is upheld. A ratio of FTE 140 to OSE 130 is material-dependent. A lower ratio (increasingly more OSE 130 than FTE 140) provides for higher resolution of conductive features when the photosensitive layer 120 is illuminated but higher transparency (radio frequency transparency) when the photosensitive layer 120 is not illuminated, while a higher ratio (increasingly more FTE 140 than OSE 130) provides for higher conductivity when the photosensitive layer 120 is illuminated and lower transparency (radio frequency transparency) when the photosensitive layer 120 is not illuminated.

The OSE 130 is a nanostructured semiconductor material that is sensitive to high energy photons. For example, the OSE 130 may include quantum dots (IIB-VIA, IVA-VIA, or IIIA-VA), vanadium oxide ($VO_2$), silicon nanoparticles, a semiconducting polymer, or other semiconducting material. The OSE 130 material can be induced to an electrically conductive state by the absorption of the photon. That is, when a light source illuminates the OSE 130, causing photoexcitation, the illuminated OSE 130 becomes conductive. Accordingly, a path of OSE 130 material may be illuminated to define a conductivity path within the photosensitive layer 120. The structure of the OSE 130 includes one or more materials that passivate the surface of the OSE 130 and thereby alter the material properties of the OSE 130. The FTE 140 is an inherently conductive nanostructured material. For example, the FTE 130 may include silver, copper, or gold nanoparticles (or another intrinsically conductive material) and may define the nano-particulate equivalent of a transmission line. Exemplary materials that may be used as FTE 130 (and may also be used as passivating material or IM 150) include poly(3,4-ethylenedioxythiophene) poly(styrenesulfonate) (PEDOT:PSS), polyaniline (PANI), and poly(3-hexylthiophene) (P3HT). The FTE 140 may also include one or more passivating materials. These passivating materials may or may not be the same as the passivating materials in the structure of the OSE 130. Exemplary passivating materials include n-butylamine (n-But), ethanedithiol (EDT), and ethanediamine (EDA).

Figure 2:
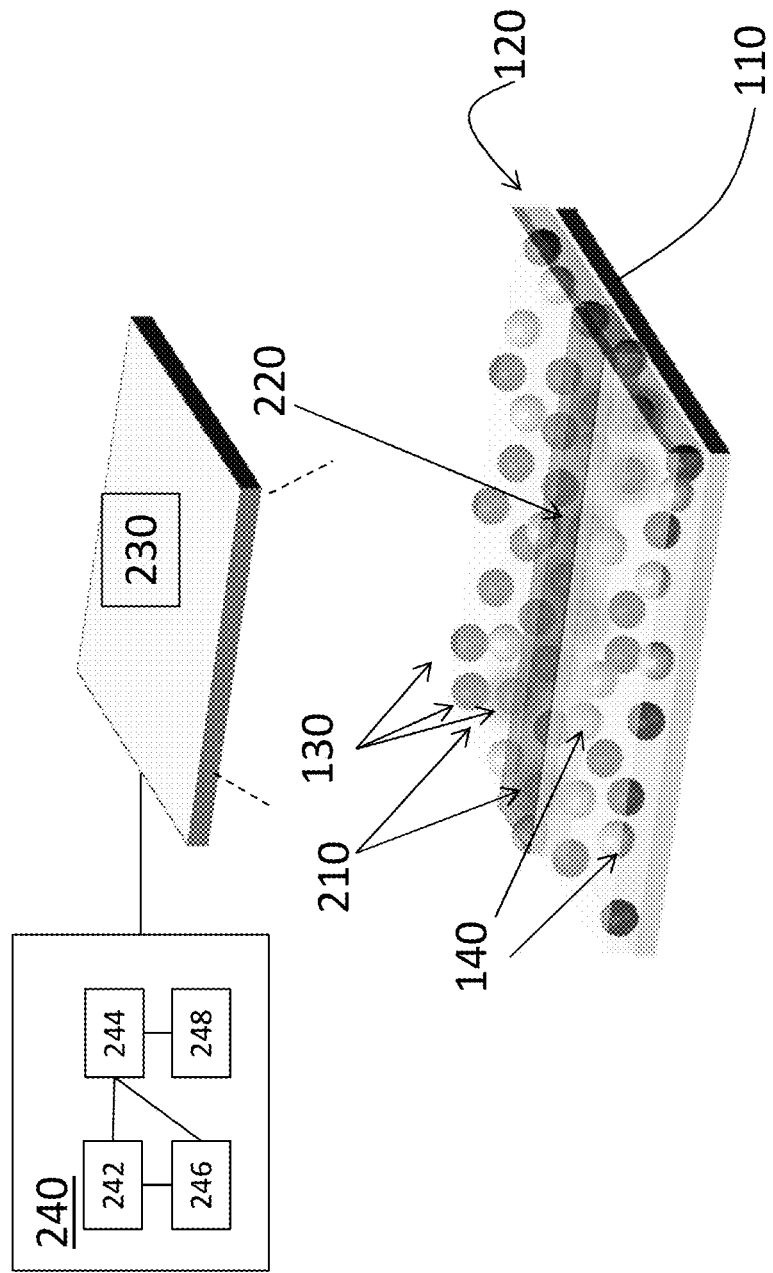
FIG. 2 shows a system to dynamically configure a conductive pathway according to an embodiment of the invention.

FIG. 2 shows a system to dynamically configure a conductive pathway according to an embodiment of the invention. As noted with reference to FIG. 1, the exemplary arrangement of the photosensitive layer 120 on the substrate 110 is not intended to limit the arrangement of the device. Both the OSE 130 and FTE 140 are shown as part of the photosensitive layer 120. The OSE 130 that are illuminated by a light source 230 (e.g., ultraviolet light. x-ray, visible, or other high energy light) are indicated by 210. While the light source 230 is shown separated from the photosensitive layer 120 in FIG. 2 for clarity, the light source 230 may be disposed directly on the photosensitive layer 120 to accurately control the areas of the photosensitive layer 120 that are illuminated. In alternate embodiments, backlighting or projection may be used to illuminate the OSE 130. A controller 240 may be used to control the light source 230. The controller 240 includes an input interface 242 (e.g., keyboard, output of another circuit), one or more processors 244, one or more memory devices 246, and an output interface 248 that outputs the signal to control the light source 230. The OSE 130 (210) that is illuminated forms conductive layers while the unilluminated OSE 130 (dark regions) are insulating. The specific regions that are conductive or that create conductive pathways between components when the device shown in FIG. 2 is incorporated in a circuit, for example, can be altered dynamically by changing the pattern of illumination. Thus, without apriori knowledge of conductive paths needed in the device, for example, the illumination by the light source 230 may be adjusted to dynamically form the conductivity path in the photosensitive layer 120.

Figure 3:
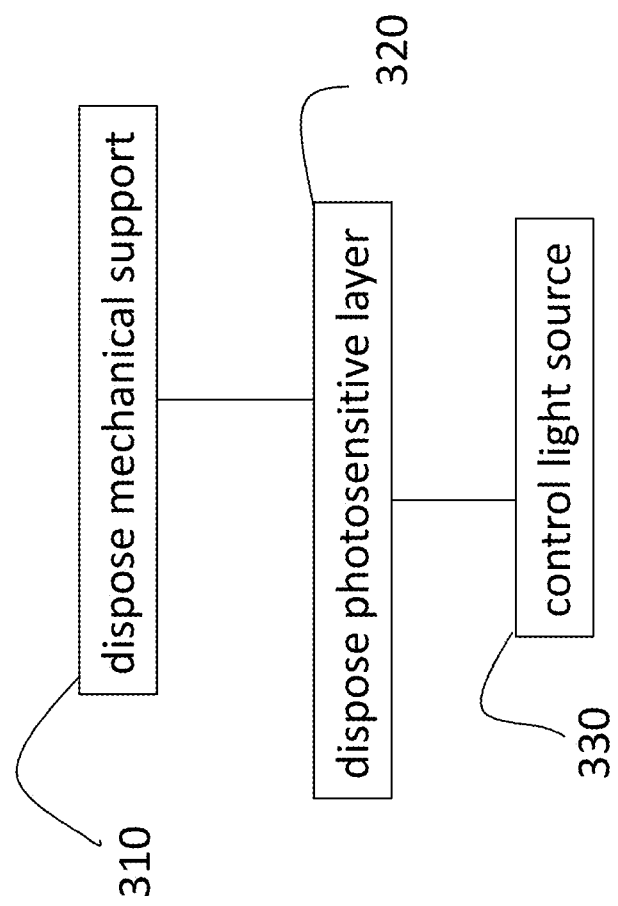
FIG. 3 is a process flow of a method of forming a dynamically configurable conductivity pathway according to an embodiment of the invention.

FIG. 3 is a process flow of a method of forming a dynamically configurable conductivity pathway according to an embodiment of the invention. At block 310, disposing a mechanical support includes disposing a substrate 110 for a circuit, for example. As noted above, the mechanical support may be any non-conductive surface on which the photosensitive layer 120 may be disposed. The mechanical support may be a radome, for example. At block 320, disposing the photosensitive layer 120 includes depositing the photosensitive layer 120 on at least part of at least one side of the mechanical support. As detailed above, the photosensitive layer 120 may include OSE 130 and FTE 140 that may be fillers in an IM 150. Controlling a light source 230 at block 330 facilitates changing conductivity of the OSE 130 in the photosensitive layer 120 to dynamically configure conductivity paths.

As noted above, additional embodiments relate specifically to dynamically routing RF energy in a transmission line. For example, the device shown in FIG. 2 may be a circuit board for an antenna, and the substrate 110 may be transparent to RF and include an internal ground plane. Components and connectors may be mounted to the surface or edge of the device. The dimensions (e.g., width, depth) of a transmission line (e.g., 220 in FIG. 2) affect the propagation of transmitted RF energy through the line. That is, the transmission line dimensions must be chosen based on the wavelength of RF energy to be transmitted, because the dimensions affect impedance, and impedance matching maximizes power transfer by preventing reflections. Thus, un-optimized transmission line dimensions will result in higher loss of signal. Accordingly, unlike the transmission of direct current through a conductive pathway, which is unaffected by the shape of the conductivity pathway trace, for example, the transmission of RF energy through a transmission line requires a determination of the proper dimensions for the transmission link. As noted above, the light source 230 may be used (controlled by a controller 240) to illuminate OSE 130 and thus initiate conductivity within the illuminated area of the photosensitive layer 120. As described below, when the necessary dimensions for the illuminated area are determined and the light source 230 is used to illuminate OSE 130 within the determined dimensions, a transmission link for routing of RF energy may be dynamically configured. The conductive traces created by the light source 230 form adaptable planar microwave circuits. Exemplary applications for the resulting device include filters, limiters, phase shifters, matching networks, patch radiators, and power dividers. Just as the conductivity pathways discussed above may be added or removed based on illumination by the light source 230, transmission lines may also be added or removed. In addition, the transmission lines may be modified (based on a modification in RF energy to be transmitted) by changing the dimensions of illumination with the same area of the photosensitive layer 120.

Figure 4:
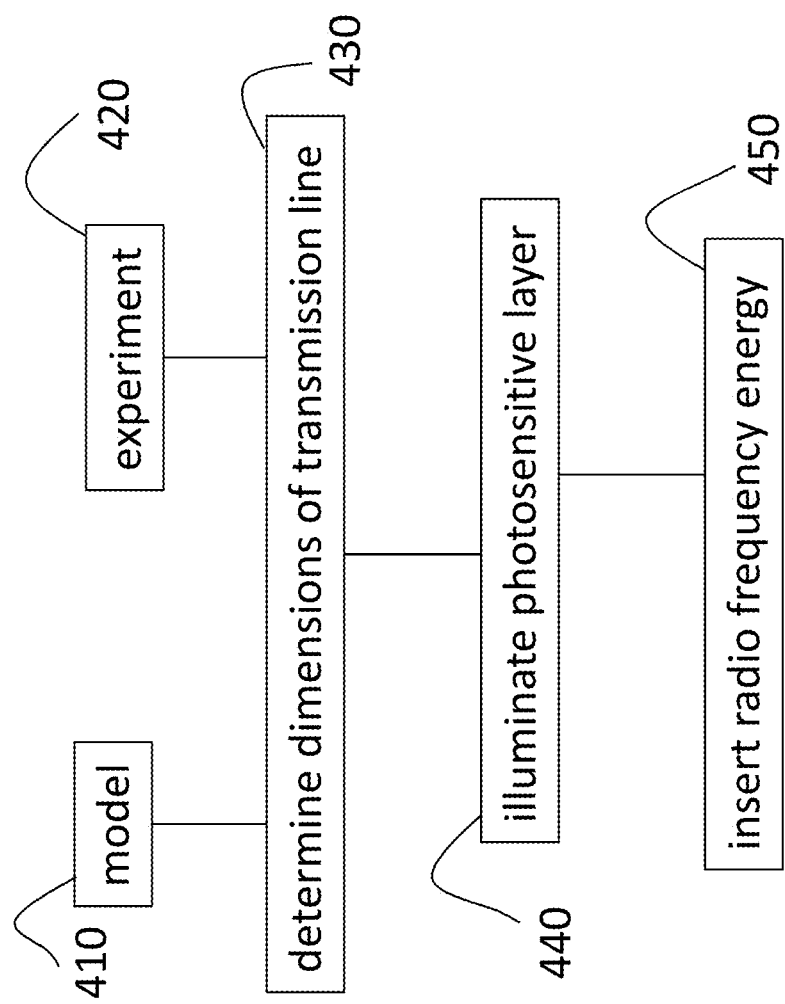
FIG. 4 is a process flow of a method of dynamically routing a transmission line according to an embodiment of the invention.

FIG. 4 is a process flow of a method of dynamically routing a transmission line according to an embodiment of the invention. At block 410, modeling may be conducted. At block 420, experimenting may be used. A combination of modeling and experimentation (e.g., modelling experimentally) may also be used for determining the dimensions needed for the transmission line (at block 430) based on the RF energy to be transmitted. Determining the dimensions of the transmission line may be done by the same controller 240 (FIG. 2) that controls the light source 230 or by one or more other controllers that provide input to the controller 24 that controls the light source 230. At block 440, illuminating the photosensitive layer 120 (the OSE 130) initiate conductivity in the illuminated area of the photosensitive layer 120 which corresponds with the dimensions determined for the transmission line (430). The illuminated OSE 130 are conductive to alternating current during photoexcitation. The OSE 130 are insulating to alternating current when not illuminated. Noting that radio frequency signals are carried by alternating currents with frequencies in the range of 3 kilohertz to 300 gigahertz, the excitation of OSE 130 within the photosensitive layer 120 with particular dimensions facilitates dynamic creation of transmission lines for routing radio frequency energy. Accordingly, dynamically creating the proper transmission line (through the illumination at block 440) for impedance matching facilitates inserting RF energy for transmission at block 450.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A method of dynamically routing a transmission line in a photosensitive layer including optically switching elements, the method comprising:
    determining dimensions of the transmission line based on a radio frequency signal configured for transmission through the transmission line; and
    controlling a light source to illuminate a portion of the optical switching elements of the photosensitive layer according to the dimensions to route the transmission line.

2. The method according to claim 1, further comprising inserting the radio frequency signal into the transmission line, formed in the area of the photosensitive layer based on the illuminating, for transmission through the transmission line.

3. The method according to claim 1, wherein the determining the dimensions is based on a wavelength of the radio frequency signal.

4. The method according to claim 1, wherein the determining the dimensions is based on experimental results.

5. The method according to claim 1, wherein the determining the dimensions is based on modeling.

6. The method according to claim 1, wherein the determining the dimensions is based on a combination of modeling and experimental results.

7. The method according to claim 1, the illuminating the portion of the optical switching elements includes illuminating the optical switching elements within a width and a depth of the photosensitive layer corresponding with the dimensions determined for the transmission line.

8. The method according to claim 1, further comprising dynamically changing the transmission line by illuminating another portion of the optical switching elements of the photosensitive layer according to second dimensions, the second dimensions being different than the dimensions.

9. The method according to claim 1, further comprising dynamically adding a second transmission line based on illuminating another portion of the optical switching elements of the photosensitive layer that are not part of the portion of the optical switching elements that form the transmission line.

10. A system to dynamically route a transmission line, the system comprising:
    a photosensitive layer disposed on at least a portion of at least one side of a mechanical support;
    a controller configured to output dimensions of the transmission line based on a radio frequency signal configured for transmission through the transmission line; and
    a light source configured to controllably illuminate a portion of the photosensitive layer according to the dimensions to route the transmission line.

11. The system according to claim 10, wherein the mechanical support is a substrate that is transparent to radio frequency energy and includes a ground plane.

12. The system according to claim 10, wherein the controller outputs the dimensions based on a wavelength of the radio frequency signal.

13. The system according to claim 10, wherein the controller outputs the dimensions based on experimental results.

14. The system according to claim 10, wherein the controller outputs the dimensions based on modeling.

15. The system according to claim 10, wherein the controller outputs the dimensions based on a combination of modeling and experimental results.

16. The system according to claim 10, wherein the light source illuminates a portion of optical switching elements within a width and a depth of the photosensitive layer corresponding with the dimensions of the transmission line.

17. The system according to claim 10, wherein the light source is further configured to dynamically change the transmission line based on illuminating a different portion of the photosensitive layer according to different dimensions.

18. The system according to claim 10, wherein the light source is further configured to dynamically add a second transmission line based on illuminating another portion of the photosensitive layer.

19. The system according to claim 10, wherein the light source illuminates optical switching elements in the portion of the photosensitive layer.

20. The system according to claim 19, wherein the optical switching element in the portion of the photosensitive layer illuminated by the light source are conductive to alternating current.

* * * * *